United States Patent [19]

Nakajima et al.

[11] Patent Number: 5,405,446
[45] Date of Patent: Apr. 11, 1995

[54] APPARATUS FOR HEAT PROCESSING A SUBSTRATE

[75] Inventors: Toshihiro Nakajima; Takatoshi Chiba; Kiyofumi Nishii; Toru Sato, all of Kyoto, Japan

[73] Assignee: Dainippon Screen Mfg. Co., Ltd., Kyoto, Japan

[21] Appl. No.: 272,486

[22] Filed: Jul. 11, 1994

[30] Foreign Application Priority Data

Jul. 16, 1993 [JP] Japan .................. 4-199293

[51] Int. Cl.$^6$ .............................. C23C 16/00
[52] U.S. Cl. .................. 118/719; 118/715; 118/725
[58] Field of Search .......... 118/715, 719, 725

[56] References Cited

U.S. PATENT DOCUMENTS

| | | | |
|---|---|---|---|
| 50,241 | 6/1991 | Kobayashi | 118/725 |
| 5,077,875 | 1/1992 | Hoke | 118/7.5 |
| 5,190,592 | 3/1993 | Chazee | 118/719 |
| 5,288,327 | 2/1994 | Bhat | 118/715 |

*Primary Examiner*—Richard Bueker
*Attorney, Agent, or Firm*—Lowe, Price, LeBlanc & Becker

[57] ABSTRACT

An apparatus for heat processing a substrate includes a heat processing furnace, which has a flat inner space for accommodating the substrate, and a gas introduction unit which introduces gas supplied via a piping into the inner space of the heat processing furnace via a gas supply inlet of the heat processing furnace. The apparatus effects the heat processing on the substrate placed within a gas flow formed in the inner space. The gas introduction unit includes a first gas introduction chamber, which receives the gas supplied via the piping for reducing a flow velocity of the gas, and a second gas introduction chamber, which is in communication with the first gas introduction chamber, is formed over at least one of outer surfaces of the top furnace wall and the bottom furnace wall at the one end of the heat processing furnace, and extends in a belt-like form through an entire width of the heat processing furnace. A portion of the top furnace wall and/or bottom furnace wall, over which the second gas introduction chamber is formed, has a nozzle opening, which covers the entire width of the heat processing furnace for flowing the gas from the second gas introduction chamber into the inner space in a direction perpendicular to the top furnace wall and/or bottom furnace wall. The gas supply port and the first gas introduction chamber are preferably separated from each other by a partition which forms a portion of a cylindrical or spherical surface and has a plurality of through-holes.

17 Claims, 4 Drawing Sheets

APPARATUS FOR HEAT PROCESSING A SUBSTRATE

BACKGROUND OF THE INVENTION

1. Field of the Invention

The present invention relates to an apparatus for heat processing a substrate, and in particular to an apparatus such as a lamp annealing apparatus and a CVD apparatus by which a substrate is annealed, oxidized or nitrided, or a film is formed on a substrate with active gas or inert gas introduced into a furnace.

2. Description of the Related Art

A certain type of apparatus for heat processing a substrate has a heat processing furnace having a flat or horizontally spread form. One substrate is placed in the furnace. Active gas or inert gas is introduced into the heat processing furnace for performing various kinds of heat processing on the substrate, and specifically for annealing, oxidizing or nitriding the substrate, or forming a film on the surface.

In the apparatus for heat processing the substrate of the aforementioned type, it is necessary to ensure high uniformity of quality of processed substrates and high reproducibility of the heat processing. For this purpose, it is desired that the gas introduced into the heat processing furnace forms a uniform flow without a turbulence or spiral flow at a region accommodating the substrate in the furnace.

In the heat processing of the substrate under a normal or high pressure, it is necessary to replace gases in the heat processing furnace within a short time in order to improve throughput. For this purpose, it is desired that the gas introduced into the heat processing furnace at a high velocity forms a uniform flow without a turbulence.

The active or inert gas is supplied into the heat processing furnace through a piping in which a gas control unit formed of, e.g., a mass-flow controller and a valve is arranged. In general, the piping has an inner diameter from about ⅛ to about ¼ inch. An area of a section, which is perpendicular to the direction of the gas flow, in the inner space of the heat processing furnace is considerable larger than that of a passage in the piping. Therefore, in order to form the aforementioned uniform flow of the gas introduced into the heat processing furnace, it is necessary to flow the gas into the heat processing furnace by a pressure which is uniform over the whole surface perpendicular to the direction of the gas flow.

For this purpose, the conventional heat processing furnace is provided at its one end with a gas introduction unit. An example of such a gas introduction unit is shown in FIGS. 1 and 2.

FIG. 1 shows a laterally sectional view showing a heat processing furnace of the apparatus for heat processing a substrate in the prior art. The apparatus for heat processing the substrate includes a heat processing furnace 50 of a flat box-like form which is open at one end and accommodates one substrate 10, and a gas introduction unit 52 arranged at the other end of heat processing furnace 50.

Gas introduction unit 52 includes a gas introduction pipe 54, which is connected to a gas supply source (not shown) via a piping and protrudes into heat processing furnace 50, and a gas nozzle pipe 56 disposed at an end of gas introduction pipe 54 in heat processing furnace 50.

Gas nozzle pipe 56 is in communication with gas introduction pipe 54. Gas nozzle pipe 56 fixed to gas introduction pipe 54 is perpendicular to the direction of the length of the gas introduction pipe 54 and parallel to the direction of the width of heat processing furnace 50. Gas nozzle pipe 56 has, at its surface opposed to substrate 10, a plurality of gas nozzle holes 58 which are distributed over the entire length thereof.

In the conventional apparatus shown in FIG. 1, gas is introduced from the gas supply source via gas introduction pipe 54 into gas nozzle pipe 56. The diameter, number and positions of gas nozzle holes 58 are determined appropriately so that the gas introduced into gas nozzle pipe 56 is distributed over the entire width of the heat processing furnace 50 (i.e., entire length of the gas nozzle pipe 56), and is supplied uniformly into the heat processing furnace 50 from a plurality of gas nozzle holes 58.

FIG. 2 shows another example of the apparatus for heat processing the substrate in the prior art. This apparatus for heat processing the substrate includes a hollow heat processing furnace 60 of a flat box-like form which is open at one end and accommodates one substrate 10, and a gas introduction unit 62 provided at the other end of the heat processing furnace 60.

Gas introduction unit 62 includes two parallel partition plates 64 and 68, which partition the inner space of heat processing furnace 60 at the other end into a first gas introduction chamber 74 and a second gas introduction chamber 76, and a gas introduction pipe 72 arranged at the other end of heat processing furnace 60. Gas introduction pipe 72 is in communication with first gas introduction chamber 74 and is connected to the gas supply source (not shown) via a piping.

Partition plates 64 and 68 are provided with a plurality of gas nozzle holes 66 and a plurality of gas nozzle holes 70, respectively. A plurality of gas nozzle holes 66 and a plurality of gas nozzle holes 70, which are formed in partition plates 64 and 68, respectively, are positioned alternately to each other in the direction of the length of partition plates 64 and 68. The first gas introduction chamber 74, second gas introduction chamber 76 and the inner space of heat processing furnace 60 are communicated with each other via gas nozzle holes 66 and 70.

In the conventional apparatus for heat processing the substrate, gas is introduced from the gas supply source via gas introduction pipe 72 into first gas introduction chamber 74. The introduced gas first impinges upon the partition plate 64 to be dispersed widthwise of the heat processing furnace 60, so that the gas is introduced uniformly into the second gas introduction chamber 76 via a plurality of gas nozzle holes 66.

The gas introduced into second gas introduction chamber 76 impinges upon partition plate 68 to be dispersed widthwise of the heat processing furnace 60, so that the gas flows uniformly into the heat processing furnace 60 through a plurality of gas nozzle holes 70.

The following problem exists in the apparatuses for heat processing the substrate having the gas introduction units shown in FIGS. 1 and 2. In these apparatuses, it is necessary to determine appropriately the diameter, number and positions of the gas nozzle holes in accordance with an intended flow rate of the gas flowing through the heat processing furnace in order to form the uniform gas flow without a turbulence at the region in the heat processing furnace accommodating the substrate. However, if the flow rate of the gas supplied into the heat processing furnace is changed in conjunction with kinds of desired processing, the flow velocity and pressure of the gas in the gas nozzle pipe or gas introduction chamber change from those corresponding to the intended flow rate described above. Therefore, the gas supply rate of a certain gas nozzle hole differs from that of another gas nozzle hole.

As described above, the gas introduction unit arranged in the conventional apparatus for heat processing the substrate enables the uniform gas flow only if the gas flow rate varies within an extremely restricted range, but cannot achieve the uniform gas flow if the gas flow rate varies over a wide rage. Consequently, the processing may be performed with the gas flow rate different from the intended flow rate described above, in which case an irregular gas flow is caused, and thus uniform heat processing cannot be effected on the substrate. For example, in the processing for oxidizing the surface of the substrate, an oxide film having a uniform thickness cannot be formed on the surface of the substrate.

The conventional apparatus also has the following disadvantage. In a certain apparatus which effects the heat processing on the substrate under the normal pressure, the gas used therein is changed from one kind to another during a series of processes. The gas remaining in the heat processing furnace must be replaced with another kind of gas to be subsequently used every time such change is to be done. If a long time is consumed in this replacement, a long time is required for completing a series of processes, resulting in a low throughput.

In the apparatus for heat processing the substrate described above, increase of the flow rate of gas may be performed as direct measures for reducing the time required for the replacement of gas in order to improve the throughput. However, in the conventional apparatus for heat processing the substrate, if the flow rate of gas is increased, uniform flow velocity of gas cannot be obtained at a plane perpendicular to the flow direction of gas and the gas flow is disturbed. Since increase of the flow rate of gas and the resultant disturbance in the gas flow cause a turbulence, the flow velocity of gas cannot be sufficiently increased in practice. The time required for replacement of gas can be reduced only to a limited value, so that the throughput cannot be improved.

The conventional apparatus also has the following disadvantage. In FIGS. 1 and 2, the gas nozzle holes of the gas introduction unit emit the gas in the direction parallel to the surface of the substrate. In this case, velocity gradient locally occurs in the gas flow as well as the periphery thereof immediately after the gas passes through the holes. Therefore, if a distance between the gas nozzle hole and the substrate is short and the number of gas nozzle holes is small, stripes consisting of thick and thin portions of gas are formed on the substrate surface. As a result, portions of the substrate surface which are exposed to the thick gas and thin gas are processed under different conditions, so that uniform heat processing cannot be performed.

The following disadvantage additionally exists in the conventional apparatus. In the conventional apparatus shown in FIG. 1, the gas nozzle pipe of the gas introduction unit is projected from the wall at the other end of the heat processing furnace toward the center of the heat processing furnace. In the apparatus shown in FIG. 2, the inner space at the other end of the heat processing furnace is partitioned by the partition plates to form the gas introduction chamber of the gas introduction unit. In either case, provision of the gas introduction unit increases the length of the heat processing furnace, resulting in increase of the entire length of the apparatus. This is also the disadvantage of the conventional apparatus.

SUMMARY OF THE INVENTION

Accordingly, it is an object of the invention to provide an apparatus for heat processing a substrate, in which a gas introduced into a heat processing furnace at a widely variable flow rate can always form a uniform flow without a turbulence.

Another object of the invention is to provide an apparatus for heat processing a substrate, in which a gas introduced into a heat processing furnace at a widely variable flow rate can always form a uniform flow without causing a turbulence and stripes consisting of thick and thin portions of gas, and which can perform heat processing uniformly on the substrate.

Still another object of the invention is to provide an apparatus for heat processing a substrate, in which a gas introduced into a heat processing furnace at a widely variable flow rate can always form a uniform flow without causing a turbulence and stripes consisting of thick and thin portions of gas, and which can perform heat processing uniformly on the substrate with a high throughput.

An apparatus for heat processing a substrate according to the invention includes a heat processing furnace and a gas introduction unit. The heat processing furnace has a substantially flat inner cavity and a gas outlet for discharging the gas from the cavity. The gas introduction unit has a gas inlet conncected to a piping for supplying the gas and introduces the gas into the cavity of the heat processing furnace via the gas supply inlet. A gas flow is formed in the cavity directed from the gas introduction unit to the gas outlet. The substrate is located within the gas flow and processed. The gas introduction unit includes a first gas introduction chamber which is in communication with the piping and receives the supplied gas for reducing a flow velocity of the gas; and a second gas introduction chamber which is in communication with the first gas introduction chamber, is formed over at least one of outer surfaces of the top furnace wall and the bottom furnace wall at the one end of the heat processing furnace, and extends in a belt-like form through an entire width of the heat processing furnace. A portion of the top furnace wall and/or a portion of the bottom furnace wall where the second gas introduction chamber is formed have a nozzle opening, which covers the entire width of the heat processing furnace and communicates the second gas introduction chamber with the inner space for flowing the gas from the second gas introduction chamber into the inner space in a direction perpendicular to at least one of the top furnace wall and the bottom furnace wall. The nozzle opening is preferably formed of a plurality of small holes or a slit. More preferably, the gas supply inlet and the first gas introduction chamber are separated from each other by a partition which forms a portion of a cylindrical or spherical surface and has a plurality of through-holes.

The velocity of the gas, which is supplied into the apparatus for heat processing the substrate via the gas supply port, is reduced owing to the fact that it is introduced into the wide space, i.e., first gas introduction chamber. The gas flows from the first gas introduction chamber toward the second gas introduction chamber along an outer wall of the heat processing furnace at the end near the gas introduction unit and turns toward the outer surface of the top furnace wall or bottom furnace wall. In this operation, the direction of the gas flow changes without fail, so that the gas disperses over the entire width of the heat processing furnace, and is supplied in the direction perpendicular to the top or bottom furnace wall of the heat processing furnace via the opening into the inner space of the heat processing furnace to cover the entire width of the heat processing furnace. The gas thus supplied impinges upon an inner surface of the top or bottom furnace wall of the heat processing furnace or impinges upon the gas flowing from the opening at the opposite furnace wall, so that the velocity thereof decreases further and then the gas flows toward the gas outlet. In the direction of the uniform gas flow, the velocity of the gas flow, which is formed immediately after it is supplied from the opening, is substantially zero regardless of where the gas is supplied. The gas supplied from the opening does not directly reach the substrate, and stripes consisting of thick and thin portions of the gas are not formed on the substrate. Accordingly, the substrate can be thermally processed more uniformly. Since the second gas introduction chamber is formed outside the top and/or bottom furnace walls of the heat processing furnace, the heat processing furnace can be shorter than the prior art. While the gas is flowing from the gas supply inlet to the inner space, the gas must change its flow direction at least one time, so that the gas distributes more uniformly. In the structure where the partition having the partial cylindrical or spherical surface is interposed between the gas supply inlet and the first gas introduction chamber, the gas supplied via the gas supply inlet is dispersed by the impingement upon the partition, and then the gas flows via a plurality of through-holes into the first gas introduction chamber and disperses widthwise of the heat processing furnace. Accordingly, the gas is introduced into the heat processing furnace at a more uniform flow velocity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
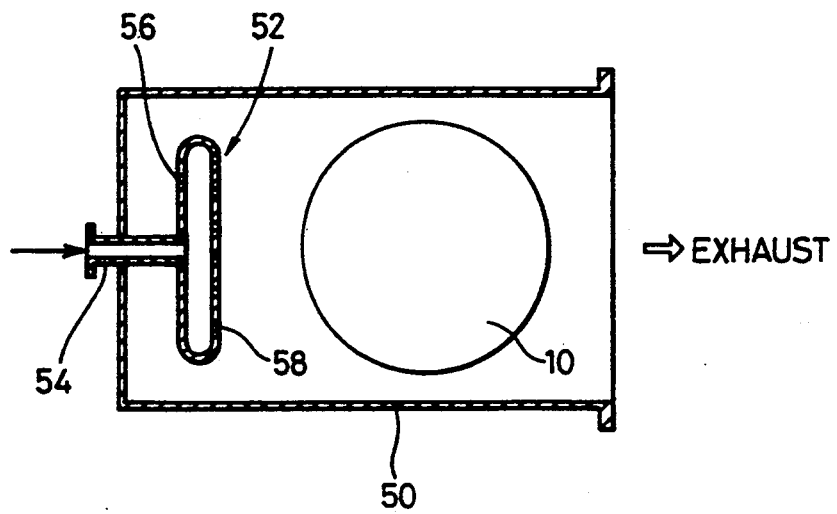
FIG. 1 is a laterally sectional view showing an example of a structure of a heat processing furnace of a conventional apparatus for heat processing a substrate.
Figure 2:
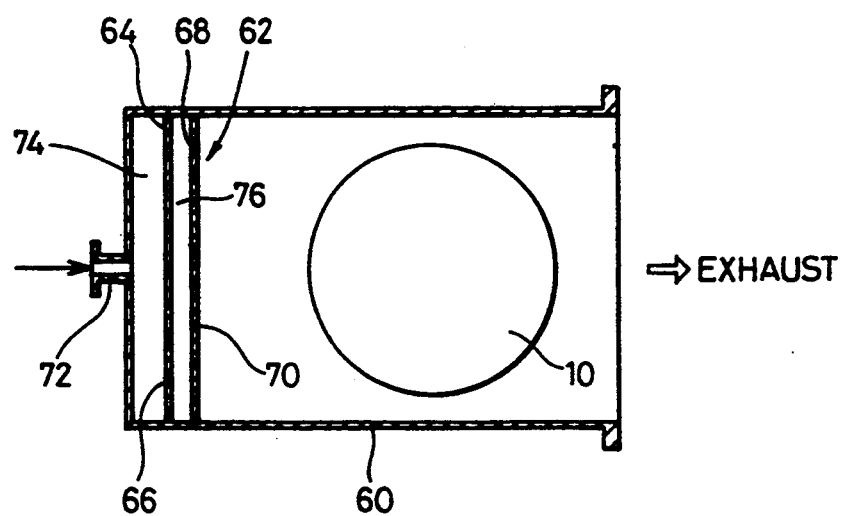
FIG. 2 is a laterally sectional view showing another example of a structure of a heat processing furnace of a conventional apparatus for heat processing a substrate.
Figure 3:
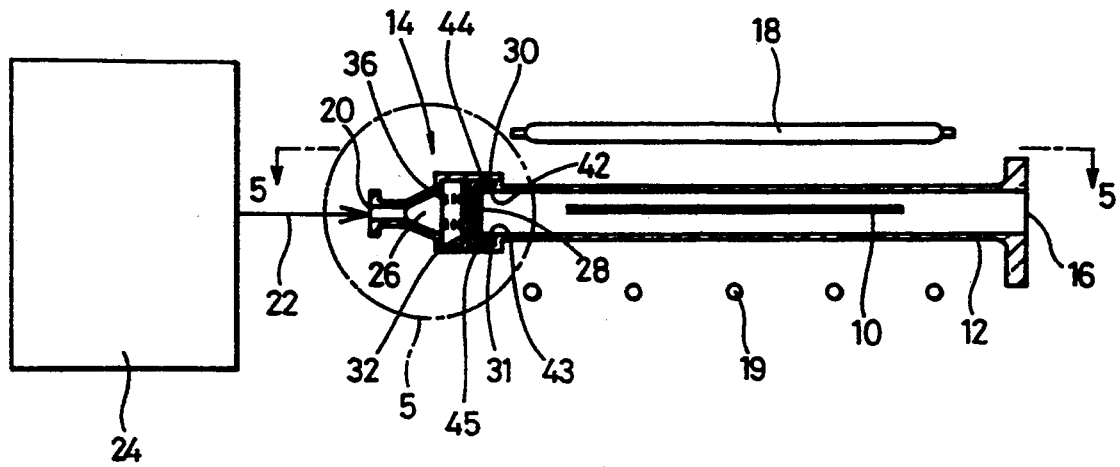
FIG. 3 is a longitudinally sectional view showing a major portion of a lamp annealing apparatus, which is an embodiment of an apparatus for heat processing a substrate according to the invention, and viewed sideways.

A lamp annealing apparatus of an embodiment of the invention will be described below with reference to FIGS. 3 to 5. Referring to FIG. 3, the lamp annealing apparatus has a heat processing furnace 12 of a flat box-like form which is made of quartz glass and has an outlet 16 at its one end. At one end of the heat processing furnace 12, there is provided a gas introduction unit 14 which is a distinctive feature of the invention. The heat processing furnace 12 accommodates one substrate 10 for each processing.

Referring to FIG. 3, a plurality of heater lamps 18 are disposed above heat processing furnace 12 and are aligned in a row on a plane opposed to the top furnace wall of heat processing furnace 12. A plurality of heater lamps 19 which extend perpendicularly to heater lamps 19 are disposed under heat processing furnace 12 and are aligned in a row on the plane opposed to the bottom furnace wall of heat processing furnace 12.

Gas introduction unit 14 has a gas supply inlet 20. Gas supply inlet 20 is connected to one end of a piping 22 made of stainless steel. Piping 22 is connected at its other end to a gas control unit 24 having a mass-flow controller and a valve. Gas control unit 24 controls a flow rate of active or inert gas supplied from a gas supply source (not shown) for supplying the same to gas introduction unit 14.

Figure 4:
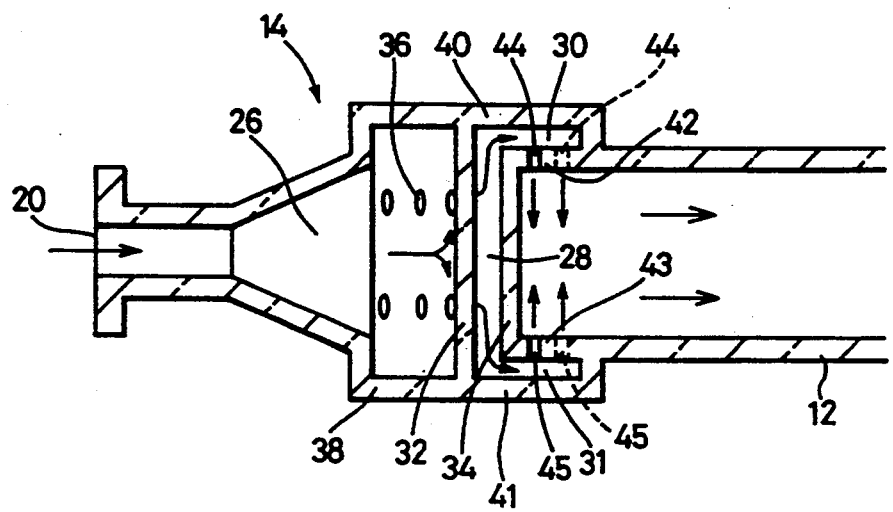
FIG. 4 is an enlarged view showing a portion 4 in FIG. 3.

Referring particularly to FIG. 4, gas introduction unit 14 is divided into four chambers, i.e., a gas inlet chamber 26 which receives the gas supplied from gas control unit 24 via piping 22, a first gas introduction chamber 28 which is in communication with gas inlet chamber 26 and is separated therefrom by a partition 32 having a plurality of through holes 36, and upper and lower second gas introduction chambers 30 and 31 communicated with first gas introduction chamber 28.

Partition 32 interposed between gas inlet chamber 26 and first gas introduction chamber 28 has a partial cylindrical form. More specifically, partition 32 has a form, which is defined by cutting a cylinder with two parallel planes perpendicular to an axis of the cylinder and further cutting the cylinder with a plane containing an axis of the cylinder. Partition 32 is opposed to a side surface 34 of the furnace wall at the other end of heat processing furnace 12. Gas inlet chamber 26 and first gas introduction chamber 28 are communicated with each other via through holes 36 in partition 32. In this embodiment, extension of an axis of each through hole 36 intersects the axis of the cylinder defined by partition 32.

First gas introduction chamber 28 is defined by a wall 38 of a hood-like form, which diverges to increase the width of heat processing furnace 12, and a side furnace wall 34 of heat processing furnace 12.

Upper and lower second gas introduction chambers 30 and 31 are defined by top and bottom furnace walls 40 and 41, which extend from wall 38 of the hood-like form and each have a belt-like form extending through the entire width of heat processing furnace 12, and top and bottom furnace walls 42 and 43 located at the other end of heat processing furnace 12. Each of the top and bottom furnace walls 42 and 43 of heat processing furnace 12 is provided with a plurality of small holes, i.e., gas nozzle holes 44 or 45 which are disposed in two rows extending widthwise of heat processing furnace 12. Holes 44 in one row are shifted widthwise from holes 44 in the other row as shown in FIG. 5, and the same is true with respect to the holes 45. Thus, any straight line passing one of holes 44 in one row and one of holes 44 in the other row does not extend in the same direction as the uniform flow of gas formed in heat processing furnace 12, and the same is true with respect to the holes 45. Nozzle holes 44 and 45 emit the gas in the direction crossing top and bottom furnace walls 42 and 43 of heat processing furnace 12. In this embodiment, the gas is emitted perpendicularly to furnace walls 42 and 43.

The lamp annealing apparatus described above operates as follows. Referring to FIGS. 3 and 5, one substrate is placed in heat processing furnace 12. The active or inert gas is supplied from gas control unit 24 to gas introduction unit 14 via piping 22.

Referring to FIG. 4, the gas flows through gas supply inlet 20 into gas inlet chamber 26 and impinges upon partition 32 to be dispersed. The gas is dispersed radially by a plurality of through-holes 36 in the partition 32, and flows into first gas introduction chamber 28. Since the sectional area of first gas introduction chamber 28 is considerably larger than that of the gas supply inlet, the velocity of gas decreases in first gas introduction chamber 28. The gas flows along side furnace wall 34 of heat processing furnace 12 defining first gas introduction chamber 28, and turns toward outer surfaces of top and bottom furnace walls 42 and 43. Thereby, the gas disperses over the entire width of heat processing furnace 12, and is guided into upper and lower second gas introduction chambers 30 and 31.

The gas guided into second gas introduction chambers 30 and 31 flows into heat processing furnace 12 via the plurality of nozzle holes 44 and 45 formed in the top and bottom furnace walls 42 and 43 of heat processing furnace 12 adjacent to first gas introduction chamber 28.

The gas supplied into gas introduction unit 14 via piping 22 successively impinges upon partition 32, side furnace wall 34 of heat processing furnace 12, and top and bottom furnace walls 40 and 41 while it flows through gas introduction unit 14. During this flow, the velocity of gas is reduced because the gas is radially dispersed by a plurality of through holes 36 in partition 32 and is introduced into first gas introduction chamber 28. The gas introduced into second gas introduction chambers 30 and 31 in this manner is uniformly distributed over the whole width of heat processing furnace 12. The gas is further distributed when it is introduced into heat processing furnace 12 through a plurality of nozzle holes 44 and 45 distributed over the whole length of heat processing furnace 12.

Therefore, even if the flow rate of gas supplied into heat processing furnace 12 is varied to a certain extent, respective nozzle holes 44 and 45 can emit the gas at the substantially constant flow rate regardless of the position of the holes 44 and 45. Accordingly, the gas in heat processing furnace 12 forms a uniform laminar flow without a turbulence.

The gas introduced into second gas introduction chambers 30 and 31 passes through a plurality of nozzle holes 44 and 45 formed in the top and bottom furnace walls 42 and 43 of heat processing furnace 12 adjacent to gas introduction unit 14, and flows in the direction crossing the top furnace wall 42 and bottom furnace wall 43. The gas flowing in this direction impinges upon the inner surfaces of bottom and top furnace walls 43 and 42 of heat processing furnace 12 or opposite gas flow, and changes its direction to flow toward the substrate 10. Owing to the fact that the gas flows as described above, the gas flow, which is formed immediately after the gas passed through the holes, has a velocity of zero or a very small value in the direction of the uniform gas flow formed in the heat processing furnace. The gas does not directly contact the substrate 10 immediately after the gas passed through nozzle holes 44 and 45, and stripes consisting of thick and thin portions of the gas are not caused on the surface of substrate 10.

The gas introduced into heat processing furnace 12 flows parallel to a plane containing the surface of substrate 10 toward outlet 16, and is discharged from heat processing furnace 12 through outlet 16. Heater lamps 18 are energized to anneal substrate 10 while maintaining the gas flow described above.

Figure 5:
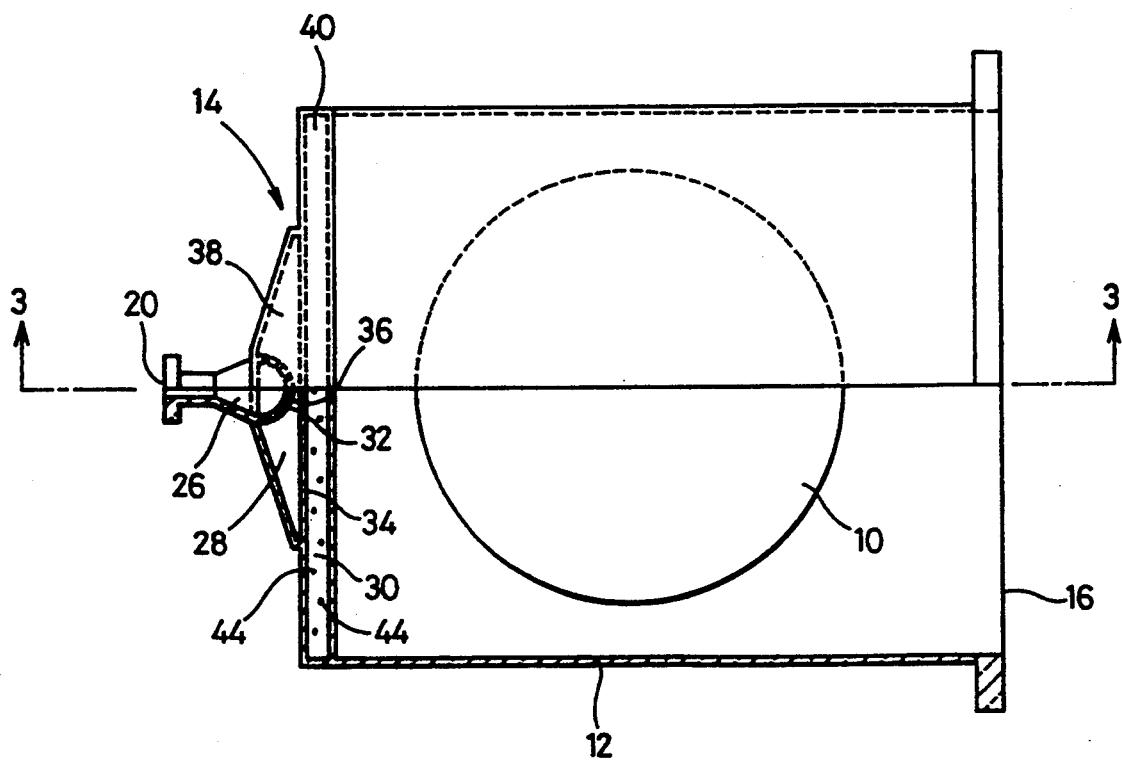
FIG. 5 is a plan of the apparatus in FIG. 3 viewed in the direction of an arrow 5, of which lower half shows a section of the apparatus.

In the apparatus described above, partition 32 has a partial cylindrical form as shown in FIGS. 3 to 5. The partition used in the apparatus of this invention is not restricted to the form of the above embodiment. Referring to FIG. 5, the partition may have any curved form provided that the gas supplied through gas inlet chamber 26 is dispersed widthwise of heat processing furnace 12 by the partition and supplied into first gas introduction chamber 28 via the through-holes formed in the partition.

Figure 6:
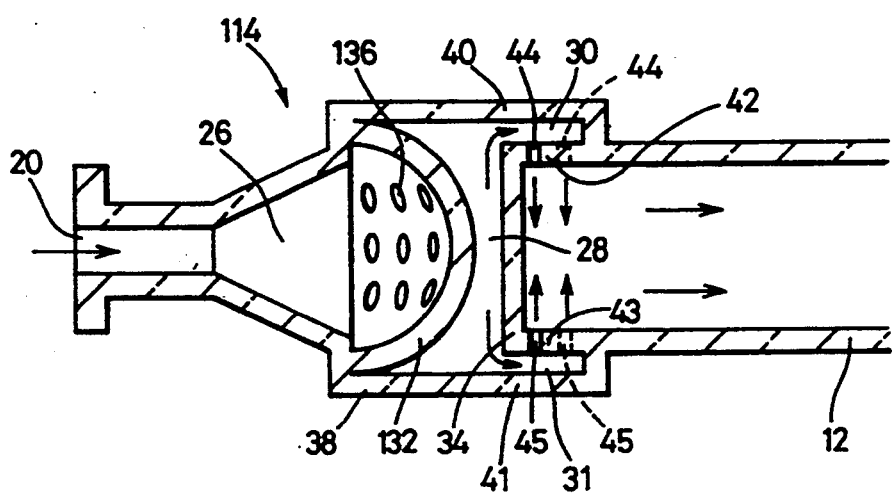
FIG. 6 is an enlarged view showing a modification of the embodiment of the invention and specifically corresponding to an enlarged view showing the portion 4 in FIG. 3.

FIG. 6 shows a cross section of a gas introduction unit 114, which uses an example of a partition of another form, viewed sideways. FIG. 6 corresponds to FIG. 4. In FIG. 6, the same portions and parts as those in FIG. 4 bear the same reference numbers, and the detailed description thereof will not be given here.

Gas introduction unit 114 shown in FIG. 6 differs from gas introduction unit 14 shown in FIG. 4 in that gas introduction unit 114 has a hemispherical partition 132 instead of partial cylindrical partition 32 shown in FIG. 4. Partition 132 has a plurality of nozzle holes or through-holes 136. Each through-hole 136 has an axis intersecting the center of a sphere defined by partition 132. Therefore, the gas which has passed through-holes 136 disperses at least in the direction of width of heat processing furnace 12 when it flows through first gas introduction chamber 28. The gas thus dispersed flows similarly to that in the apparatus shown in FIGS. 3 to 5, and more specifically flows from gas introduction chambers 30 and 31 through nozzle holes 44 and 45 into heat processing furnace 12. The structure shown in FIG. 6 can achieve the effect similar to that by the apparatus shown in FIGS. 3 to 5.

The apparatuses described above are provided with second gas introduction chambers 30 and 31 formed above and below heat processing furnace 12. The invention, however, is not restricted to this structure. For example, the apparatus may be provided with only one of the second gas introduction chambers 30 and 31.

Each of top and bottom furnace walls 42 and 43 of heat processing furnace 12 adjacent to gas introduction unit 14 is provided with a plurality of nozzle holes 44 or 45. The invention, however, is not restricted to this structure. For example, the top and/or bottom furnace walls 42 and 43 may be provided with slits extending over the whole width of heat processing furnace 12.

Figure 7:
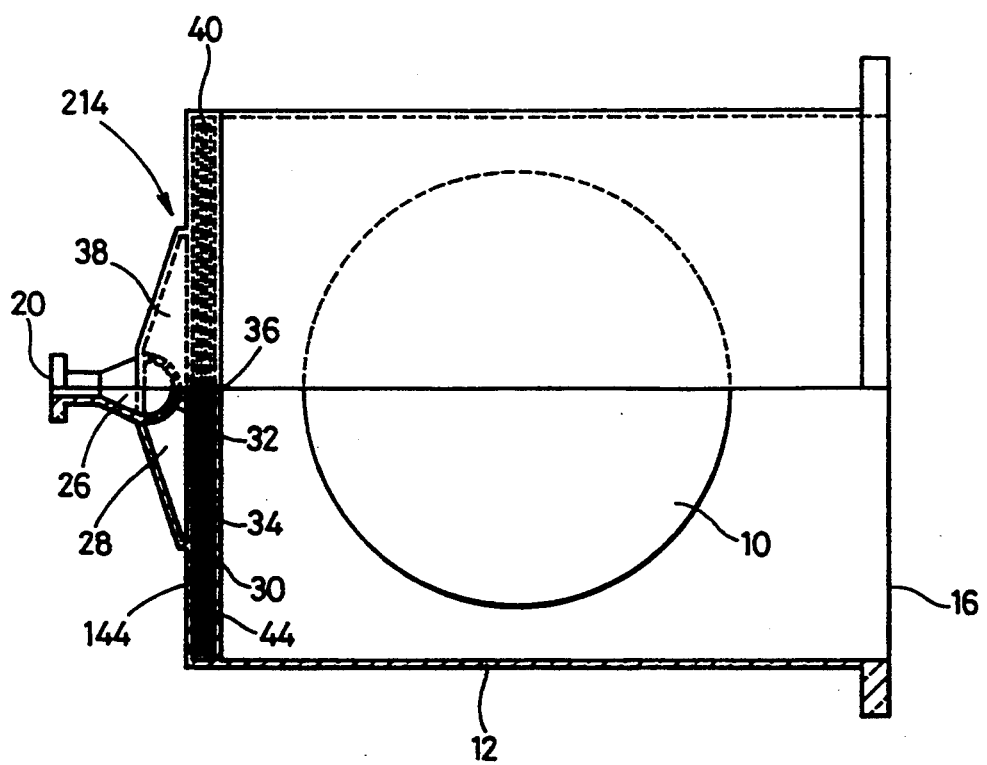
FIG. 7 is a plan showing still another modification of the embodiment of the invention and specifically corresponding to FIG. 5.

FIG. 7 is a plan showing an apparatus, which has gas supply slits 144 instead of a plurality of holes 44 and 45 in the apparatus shown in FIGS. 3 to 5, and corresponding to FIG. 5.

Referring to FIG. 7, slits 144 of a gas introduction unit 214 are formed at the top and bottom furnace walls of heat processing furnace 12 near gas introduction unit 214, and extend over the whole width thereof. The apparatus employing slits 144 instead of holes 44 and 45 can achieve the effect similar to that by the apparatus employing holes 44 and 45. The slit 144 may be formed in only one of top and bottom furnace walls 42 and 43. In FIG. 7, two slits 144 are formed in top furnace wall 42 and are spaced from each other in the direction parallel to the gas flow. The invention, however, is not restricted to this, and only one slit may be formed at the top furnace wall 42. The slit(s) may be formed in only one of top and bottom furnace walls 42 and 43.

According to the invention, as described above, even if the gas flow rate varies over a wide range, the gas introduced into the heat processing furnace forms a uniform flow in the heat processing furnace without a turbulence. Stripes consisting of thick and thin portions of gas are not formed on the surface of substrate. Since heat processing can be effected uniformly on the substrate, the quality can be improved. Even if the flow rate of gas is increased, no turbulence of gas is caused in the heat processing furnace. Therefore, if it is necessary to replace a gas with another kind of gas in the heat processing furnace for changing the kinds of gases used in the apparatus, the gases can be replaced within a short time, so that a throughput in a series of processes using several kinds of gases can be improved. According to the invention, the second gas introduction chamber(s) are formed above and below the heat processing furnace. Therefore, the length of heat processing furnace can be reduced, and the whole sizes of the apparatus for heat processing the substrate can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for heat processing a substrate comprising:
    a heat processing furnace having a substatially flat inner cavity formed by at least a top furnace wall and a bottom furnace wall for accomodating a substrate in said cavity; and
    gas introducing means which is attached to said heat processing furnace for introducing a gas into said inner cavity of said heat processing furnace via one end of said cavity; wherein
    said heat processing furnace is provided with a gas outlet for discharging the gas from the cavity,
    said apparatus processes a substrate accomodated in a gas flow in said cavity directed from said gas introducing means to said gas outlet; and
    said gas introducing means comprises:
    a gas inlet to be connected to a piping which supplied the gas,
    a first gas introduction chamber which is in communication with said gas inlet for receiving said supplied gas and reducing a flow velocity of the gas; and
    a second gas introduction chamber which is in communication with said first gas introduction chamber, is formed over at least one of outer surfaces of said top furnace wall and said bottom furnace wall at said one end of said heat processing furnace, and extends in a belt-like form through an entire width of said heat processing furnace, wherein
    a portion of at least one of said top furnace wall and said bottom furnace wall, where said second gas introduction chamber is formed, adjacent to said one end of said heat processing furnace has a nozzle opening, which covers the entire width of said heat processing furnace and connects said second gas introduction chamber with said inner space for flowing the gas from said second gas introduction chamber into said inner space in a direction perpendicular to at least one of said top furnace wall and said bottom furnace wall.

2. The apparatus according to claim 1, wherein said gas introducing means includes a partition having a curved surface, said partition being interposed between said gas supply inlet and said first gas introduction chamber and having a plurality of through-holes for connecting said gas supply inlet and said first gas introduction chamber with each other.

3. An apparatus according to claim 2, wherein said curved surface of said partition is a portion of a periphery of a cylinder having an axis perpendicular to said top furnace wall and said bottom furnace wall.

4. The apparatus according to claim 3, wherein a portion of at least one of said top furnace wall and said bottom furnace wall, which is adjacent to said one end of said heat processing furnace, and where said second gas introduction chamber is formed, has a plurality of small holes forming said nozzle opening.

5. The apparatus according to claim 4, wherein said plurality of small holes formed at either or both of said top furnace wall and said bottom furnace wall are disposed in a plurality of rows extending widthwise of said heat processing furnace.

6. The apparatus according to claim 5, wherein said plurality of rows of said plurality of small holes include first and second rows adjoining to each other, and
    said small holes in said first row and said small holes in said second row are disposed such that said small holes in said first row and said small holes in said second row are not aligned with each other in a direction of said gas flow in said heat processing furnace.

7. The apparatus according to claim 3, wherein a portion of at least one of said top furnace wall and said bottom furnace wall, which is adjacent to said one end of said heat processing furnace, and where said second gas introduction chamber is formed, has a slit having a length substantially equal to the width of said heat processing furnace and forming said nozzle opening.

8. The apparatus according to claim 2, wherein said curved surface of said partition is a portion of a spherical surface having a center at a position intermediate said top furnace wall and said bottom furnace wall.

9. The apparatus according to claim 2, wherein said nozzle opening formed in a portion of at least one of said top furnace wall and said bottom furnace wall, which is adjacent to said one end of said heat processing furnace, and where said second gas introduction chamber is formed, is formed of a plurality of small holes.

10. The apparatus according to claim 2, wherein a portion of at least one of said top furnace wall and said bottom furnace wall, which is adjacent to said one end of said heat processing furnace, and where said second gas introduction chamber is formed, has a slit having a length substantially equal to the width of said heat processing furnace and forming said nozzle opening.

11. The apparatus according to claim 10, wherein a plurality of said slits are formed and aligned to each other in the direction of the gas flow in said heat processing furnace.

12. The apparatus according to claim 1, wherein a portion of at least one of said top furnace wall and said bottom furnace wall, which is adjacent to said one end of said heat processing furnace, and where said second gas introduction chamber is formed, has a plurality of small holes forming said nozzle opening.

13. The apparatus according to claim 12, wherein said plurality of small holes formed at either or both of said top furnace wall and said bottom furnace wall are disposed in a plurality of rows extending widthwise of said heat processing furnace.

14. The apparatus according to claim 13, wherein said plurality of rows of said plurality of small holes include first and second rows adjoining to each other, and
said small holes in said first row and said small holes in said second row are disposed such that said small holes in said first row and said small holes in said second row are not aligned with each other in a direction of said gas flow in said heat processing furnace.

15. The apparatus according to claim 1, wherein a portion of at least one of said top furnace wall and said bottom furnace wall, which is adjacent to said one end of said heat processing furnace, and where said second gas introduction chamber is formed, has a slit having a length substantially equal to the width of said heat processing furnace and forming said nozzle opening.

16. The apparatus according to claim 15, wherein a plurality of said slits are formed and aligned to each other in the direction of the gas flow in said heat processing furnace.

17. The apparatus according to claim 1, wherein both of said top furnace wall and said bottom furnace wall are provided at their portions adjacent to said one end of said heat processing furnace with said nozzle openings.

* * * * *